(12) United States Patent
Hsieh et al.

(10) Patent No.: US 9,423,189 B2
(45) Date of Patent: Aug. 23, 2016

(54) FLUID HEAT EXCHANGE APPARATUS

(71) Applicant: Acer Incorporated, New Taipei (TW)

(72) Inventors: Cheng-Wen Hsieh, New Taipei (TW);
Wen-Neng Liao, New Taipei (TW)

(73) Assignee: Acer Incorporated, New Taipei (TW)

( * ) Notice: Subject to any disclaimer, the term of this patent is extended or adjusted under 35 U.S.C. 154(b) by 486 days.

(21) Appl. No.: 13/831,830

(22) Filed: Mar. 15, 2013

(65) Prior Publication Data
US 2014/0138052 A1    May 22, 2014

(30) Foreign Application Priority Data
Nov. 19, 2012    (TW) .............................. 101143122 A

(51) Int. Cl.
| | |
|---|---|
| *F28F 1/00* | (2006.01) |
| *G06F 1/20* | (2006.01) |
| *H05K 7/20* | (2006.01) |
| *H01L 23/427* | (2006.01) |

(Continued)

(52) U.S. Cl.
CPC . *F28F 1/00* (2013.01); *F28D 15/02* (2013.01); *F28F 13/08* (2013.01); *G06F 1/20* (2013.01); *H01L 23/427* (2013.01); *H05K 7/20809* (2013.01); *F28F 2265/00* (2013.01); *G06F 2200/201* (2013.01); *H01L 2924/0002* (2013.01)

(58) Field of Classification Search
CPC ................ F28D 2021/0028; F28D 2021/0029; H01L 23/367; H01L 23/3672; H01L 23/433; H05K 7/2029; H05K 7/203; H05K 7/20309; H05K 7/20327
USPC ............. 165/104.21, 104.17, 104.32, 104.27, 165/104.28, 104.33
See application file for complete search history.

(56) References Cited

U.S. PATENT DOCUMENTS

| | | | | |
|---|---|---|---|---|
| 5,044,426 A | * | 9/1991 | Kneidel | 165/104.27 |
| 5,360,058 A | * | 11/1994 | Koeppl et al. | 165/104.26 |
| 5,388,635 A | * | 2/1995 | Gruber et al. | 165/80.4 |

(Continued)

FOREIGN PATENT DOCUMENTS

| | | |
|---|---|---|
| CN | 101726136 | 6/2010 |
| TW | 201237339 | 9/2012 |
| WO | 2004038318 | 5/2004 |

OTHER PUBLICATIONS

R. H. Sellin, "Flow in Channels", 1970, CRC Press, XP002727469, ISBN: 0677616503, p. 69, line 4-line 14.

(Continued)

*Primary Examiner* — Frantz Jules
*Assistant Examiner* — Nelson Nieves
(74) *Attorney, Agent, or Firm* — Jianq Chyun IP Office

(57) ABSTRACT

A fluid heat exchange apparatus including a casing, and a heat-dissipating device is provided. The casing includes a chamber, an inlet, and an outlet. The chamber includes a first channel including a first entrance and a first exit and a second channel including a second entrance and a second exit. The cross-sectional area of the first channel decreases from the first entrance to the first exit and the cross-sectional area of the second channel decreases from the second entrance to the second exit. The heat-dissipating device is located between the first exit and the outlet. A first fluid flows from the inlet and flows through the first channel and the heat-dissipating device and then flows to the outlet. Part of the first fluid flowing through the heat-dissipating device absorbs heat and forms bubbles moving to the second channel and then forms a second fluid converging into the first channel.

8 Claims, 2 Drawing Sheets

(51) Int. Cl.
*F28F 13/08* (2006.01)
*F28D 15/02* (2006.01)

(56) References Cited

U.S. PATENT DOCUMENTS

| | | | | |
|---|---|---|---|---|
| 5,390,077 | A | | 2/1995 | Paterson |
| 5,713,413 | A | * | 2/1998 | Osakabe et al. .......... 165/104.33 |
| 5,957,194 | A | * | 9/1999 | Azar ............................ 165/80.3 |
| 6,994,151 | B2 | * | 2/2006 | Zhou et al. ............... 165/104.21 |
| 2004/0052049 | A1 | * | 3/2004 | Wu et al. .................. 165/104.33 |
| 2007/0119573 | A1 | * | 5/2007 | Mahalingam et al. ....... 165/80.4 |
| 2009/0223650 | A1 | * | 9/2009 | Williams et al. .......... 165/104.17 |
| 2011/0214840 | A1 | | 9/2011 | Sakamoto et al. |
| 2012/0012284 | A1 | * | 1/2012 | Salamon .................... 165/109.1 |
| 2012/0018133 | A1 | * | 1/2012 | Postma et al. ............ 165/104.21 |
| 2012/0097382 | A1 | * | 4/2012 | Chen ...................... F28F 19/00 165/185 |
| 2012/0106074 | A1 | * | 5/2012 | Barowski et al. ......... 361/679.54 |
| 2012/0247737 | A1 | * | 10/2012 | Livingston .......... F28D 15/0233 165/104.29 |
| 2013/0027884 | A1 | * | 1/2013 | Campbell ............ H05K 7/2029 361/700 |
| 2013/0146259 | A1 | * | 6/2013 | Oh et al. ................... 165/104.28 |
| 2013/0255920 | A1 | * | 10/2013 | Yamauchi et al. ....... 165/104.21 |
| 2013/0312937 | A1 | * | 11/2013 | Tsukinari .............. H01L 23/427 165/104.21 |
| 2013/0327505 | A1 | * | 12/2013 | Gonzalez et al. ........ 165/104.26 |

OTHER PUBLICATIONS

Javier Jimenez, "Turbulent Flows Over Rough Walls", vol. 36, Jan. 2004, pp. 173-196, XP002727635, Retrived from the Internet: URL: http://me.queensu.ca/Courses/441/files/ TURBULENTFLOWSOVERROUGHWALLSJimenez_ ARFMO4.pdf[retrieved on Jul. 23, 2014].

* cited by examiner

FLUID HEAT EXCHANGE APPARATUS

CROSS-REFERENCE TO RELATED APPLICATION

This application claims the priority benefit of Taiwan application serial no. 101143122, filed on Nov. 19, 2012. The entirety of the above-mentioned patent application is hereby incorporated by reference herein and made a part of this specification.

BACKGROUND OF THE INVENTION

1. Field of the Invention

The invention relates to a heat exchange apparatus. More particularly, the invention relates to a fluid heat exchange apparatus.

2. Description of Related Art

A server is the core which serves all the computers in a network system and has functions of providing network users discs, printing service, and so forth. Also, the server allows the users to share resources in the network. A basic frame of the server is approximately the same as that of an ordinary personal computer and consists of a central processing unit (CPU), a memory, and I/O equipment, which are connected by internal bus. Through north bridge chips, the CPU and the memory are connected, and through south bridge chips, the I/O equipment is connected.

During operation of the server and other large computer equipment, a huge amount of heat energy is expected to be generated. Hence in designing such equipment, how to solve problems associated with heat dissipation in an efficient way is a subject worthy of study. The server, for example, currently adopts a fluid heat exchange apparatus as a heat-dissipating method.

A conventional fluid heat exchange apparatus reduces heat in a system by using a cooling fluid which flows into a cooling apparatus so as to carry away the heat of the server. However, after flowing into the cooling apparatus and absorbing the heat, the cooling fluid is vaporized into bubbles. These bubbles may clog within internal chambers of the fluid heat exchange apparatus, obstructing flow of the cooling fluid.

One way to solve the bubbles issue is that the size of the cross-sectional area is increasing along the flowing direction of the cooling fluid so as to increase the speed of the cooling fluid because of the pressure gradient, but the bubbles are actually in the cooling apparatus as the flowing resistance of the cooling fluid.

Another way to solve the bubbles issue is that the inlet of the cooling apparatus is smaller than the outlet of the cooling apparatus, and this way not only causes the same effect of the way described above that the bubbles are actually in the cooling apparatus as the flowing resistance of the cooling fluid, but the hydraulic head of the cooling fluid are decreased because of smaller inlet.

In addition, the fluid heat exchange apparatus utilizes a pump to provide a pressure difference which causes the cooling fluid to flow. However, a large number of cooling apparatuses is usually required in the server in order to help effectively dissipate the heat energy away. Accordingly, the pump requires being provided with a considerable amount of energy for allowing the cooling fluid to flow smoothly. Such operation is very energy-consuming. There is therefore a need for a fluid heat exchange apparatus which reduces load on the pump and also effectively solves the problem of bubble clogging.

SUMMARY OF THE INVENTION

The invention provides a fluid heat exchange apparatus which solves the problem of bubble clogging and improves flow efficiency of a fluid flowing therein.

The invention proposes a fluid heat exchange apparatus including a casing and a heat-dissipating device. The casing includes a chamber, an inlet and an outlet. The chamber communicates between the inlet and the outlet, wherein the inlet is configured to allow a first fluid to flow into the chamber, and the outlet is configured to allow the first fluid to flow out of the chamber. The chamber includes a first channel and a second channel. The first channel has a first entrance and a first exit, and the second channel has a second entrance and a second exit. The first entrance and the second exit are communicated to the inlet. A cross-sectional area of the first channel decreases from the first entrance to the first exit, and a cross-sectional area of the second channel decreases from the second entrance to the second exit. The heat-dissipating device is disposed in the chamber and located between the first exit and the outlet.

Based on the above, in the fluid heat exchange apparatus of the invention, due to that the cross-sectional area of the first channel decreases from the first entrance to the first exit, a flow speed of the first fluid increases while pressure decreases, so that the first fluid flows naturally, and load on a pump during operation of the fluid heat exchange apparatus is reduced. Furthermore, since bubbles formed by the first fluid after flowing through the heat-dissipating device flow to the second channel, and then condense into liquid via a heat-absorbing device, the chamber does not get clogged with the bubbles and flow of the first fluid is not affected. In addition, as the cross-sectional area of the second channel decreases from the second entrance to the second exit, while a second fluid condensed by the bubbles flows through the second channel, a flow speed of the second fluid is increasing. Consequently, when the second fluid joins the first fluid after flowing out of the second channel, the first fluid is driven to speed up in accordance with the high speed of the second fluid.

To make the aforementioned features and advantages of the invention more comprehensible, embodiments accompanied with figures are described in detail below.

DESCRIPTION OF EMBODIMENTS

Figure 1:
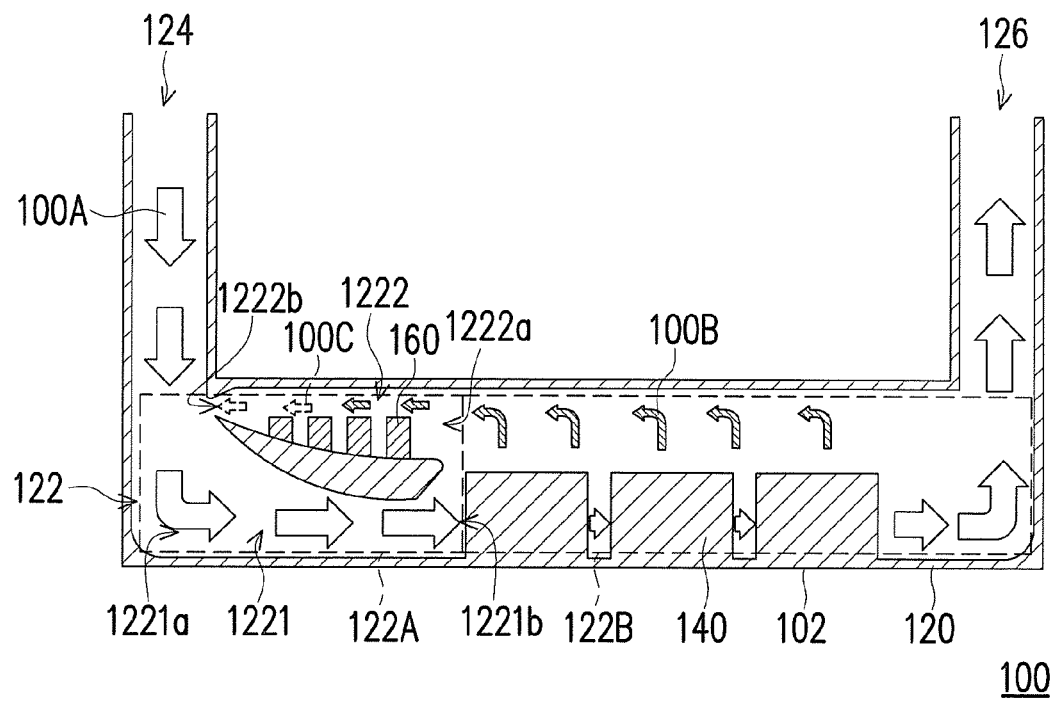
FIG. 1 is a schematic cross-sectional view of a fluid heat exchange apparatus according to an embodiment of the invention.

FIG. 1 is a schematic cross-sectional view of a fluid heat exchange apparatus according to an embodiment of the invention. Please refer to FIG. 1. A fluid heat exchange apparatus 100 includes a casing 120, a heat-dissipating device 140, and a heat-absorbing device 160. The casing 120 has a chamber 122, an inlet 124, and an outlet 126. The inlet 124 and the outlet 126 are respectively located at two sides of the chamber 122, and the chamber 122 communicates between the inlet 124 and the outlet 126. In the present embodiment, the chamber 122 is divided into a first chamber 122A and a second chamber 122B communicating with the first chamber 122A, wherein the inlet 124 is communicated to the first chamber 122A, and the outlet 126 is communicated to the second chamber 122B. In the present embodiment, the fluid heat exchange apparatus 100 is applied to, for example, a server. A bottom 102 of the fluid heat exchange apparatus 100 is in contact with a heat source (not illustrated), such as a CPU or a chip module, in the server. The heat-dissipating device 140 is provided corresponding to the heat source in the server. In the present embodiment, the heat-dissipating device 140 includes a plurality of heat-dissipating fins so as to improve heat dissipation efficiency of the fluid heat exchange apparatus 100.

Here, arrows in FIG. 1 are illustrated to have different patterns so as to represent fluids in different states. The inlet 124 is configured to allow a first fluid 100A to flow into the chamber 122, and the outlet 126 is configured to allow the first fluid 100A to flow out of the chamber 122. In FIG. 1, solid-lined arrows indicate flow directions of the first fluid 100A. In the fluid heat exchange apparatus 100 in the present embodiment, a pump (not illustrated) is utilized to apply pressure to cause the first fluid 100A to flow into the chamber via the inlet 124 and then flows out of the chamber 122 via the outlet 126.

Please refer to FIG. 1. The chamber 122 includes a first channel 1221 and a second channel 1222 located in the first chamber 122A. The first channel 1221 has a first entrance 1221a and a first exit 1221b, and the second channel 1222 has a second entrance 1222a and a second exit 1222b, wherein the first entrance 1221a and the second exit 1222b are located at the same side of the first chamber 122A, and the second entrance 1222a and the first exit 1221b are located at another side of the first chamber 122A. As shown in FIG. 1, a cross-sectional area of the first channel 1221 decreases from the first entrance 1221a to the first exit 1221b, and a cross-sectional area of the second channel 1222 decreases from the second entrance 1222a to the second exit 1222b. The heat-dissipating device 140 is disposed in the second chamber 122B and located between the first exit 1221b and the outlet 126. The heat-absorbing device 160 is disposed in the second channel 1222.

After flowing into the chamber 122 via the inlet 124, the first fluid 100A flows into the first channel 1221 via the first entrance 1221a, and then flows out of the first channel 1221 via the first exit 1221b. Next, the first fluid 100A flows through the heat-dissipating device 140 outside the first exit 1221b. Part of the first fluid 100A is vaporized into bubbles 100B by absorbing heat from the heat-dissipating device 140, while another part of the first fluid 100A goes on flowing toward the outlet 126.

To distinguish the flow directions of the bubbles 100B from those of the first fluid 100A, in FIG. 1, two different kinds of arrows indicate the flow directions of the aforementioned two parts of the fluid. The arrows shown in hatched lines indicate the flow directions of the bubbles 100B in the second channel 1222. The bubbles 100B flow into the second channel 1222 via the second inlet 1222a, and flow through the heat-absorbing device 160 in the second channel 1222.

When flowing through the heat-absorbing device 160, the bubbles 100B are cooled and condensed into a second fluid 100C. Next, the second fluid 100C flows out of the second channel 1222 via the second exit 1222b, and flows into the first channel 1221 after joining the first fluid 100A. In FIG. 1, dashed-lined arrows indicate flow directions of the second fluid 100C. In the present embodiment, after flowing into the chamber 122, the first fluid 100A first flows through the first channel 1221, and then flows through the heat-dissipating device 140 to form the bubbles 100B. After that, the bubbles 100B flow into the second channel 1222, and condense into the second fluid 100C by means of the heat-absorbing device 160. The second fluid 100C then joins the first fluid 100A and flows into the first channel 1221.

In the present embodiment, the heat-absorbing device 160 includes a plurality of fins to improve efficiency of cooling the bubbles 100B into the second fluid 100C. As illustrated in FIG. 1, the second channel 1222 is located above the first channel 1221, and thus the aforementioned flow paths form a recirculation path in the chamber 122. Accordingly, since the first fluid 100A recirculates rather than accumulates after being vaporized into the bubbles 100B by absorbing the heat from the heat-dissipating device 140, flow of the first fluid 100A in the chamber 122 toward the outlet 126 is not affected.

In the present embodiment, the cross-sectional area of the first channel 1221 decreases from the first entrance 1221a to the first exit 1221b, and the cross-sectional area of the second channel 1222 decreases from the second entrance 1222a to the second exit 1222b. In the process wherein the first fluid 100A flows into the first channel 1221 via the first entrance 1221a and flows out of the first channel 1221 via the first exit 1221b, the decreasing cross-sectional area causes the flow speed of the first fluid 100A to increase accordingly, and the pressure of the first fluid 100A to decrease accordingly. In this way, kinetic energy of the first fluid 100A is utilized as much as it could be as flowing energy required during the process, so that the first fluid 100A flows naturally in the first channel 1221 from the first entrance 1221a to the first exit 1221b, thereby reducing load on the pump.

In addition, when the bubbles 100B generated by vaporization of the first fluid 100A flow into the second channel 1222 via the second entrance 1222a, the bubbles 100B flow through the heat-absorbing device 160 and are cooled into the second fluid 100C. Since the cross-sectional area of the second channel 1222 decreases from the second entrance 1222a to the second exit 1222b, a flow speed of the second fluid 100C in the second channel 1222 becomes faster and faster. In the present embodiment, the cross-sectional area of the second exit 1222b is designed to be minimal, so that a ratio of the cross-sectional area of the second entrance 1222a to that of the second exit 1222b becomes maximal. Accordingly, when the second fluid 100C flows out from the second exit 1222b, the flow speed thereof is increased, and the second fluid 100C leaves the second exit 1222b at high speed and then rejoins the first fluid 100A. When the high-speed second fluid 100C joins the first fluid 100A, the first fluid 100A is driven to speed up, achieving an even faster flow speed. Following the above, in the present embodiment, by means of the design in which the cross-sectional areas of the channels decrease from the entrances to the exits, the flow efficiency of the first fluid 100A and the second fluid 100C in the fluid heat exchange apparatus 100 is improved.

Figure 2:
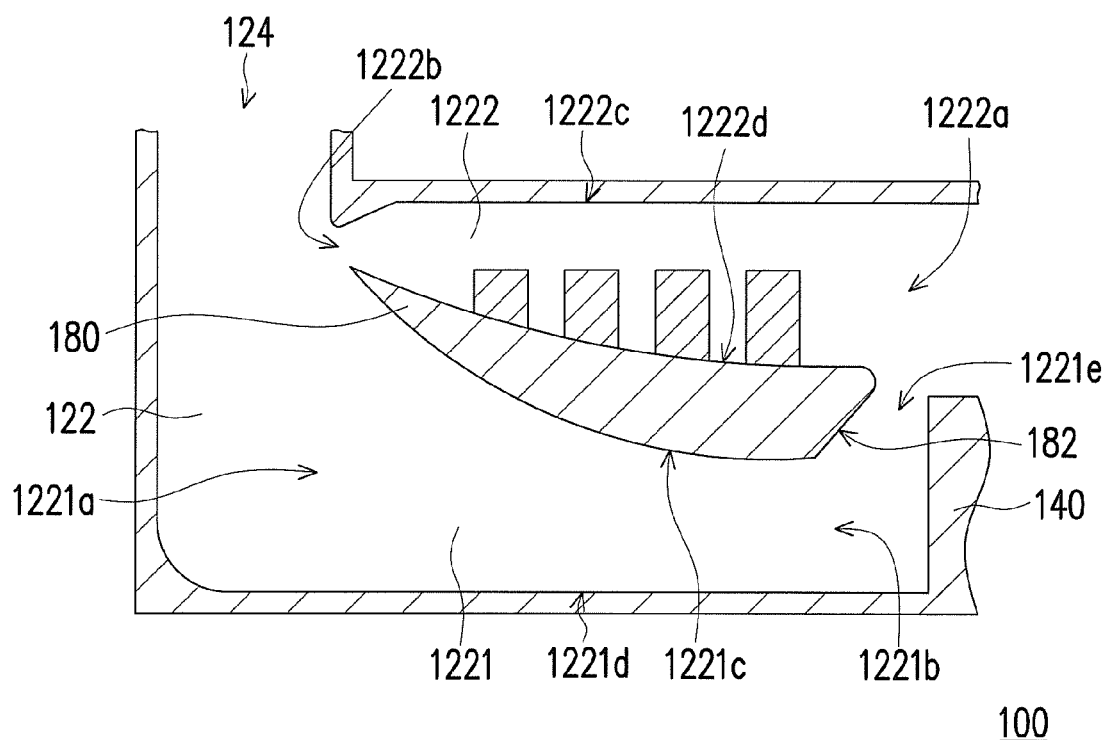
FIG. 2 is a schematic partially-enlarged cross-sectional view of the fluid heat exchange apparatus in FIG. 1.

FIG. 2 is a schematic partially-enlarged cross-sectional view of the fluid heat exchange apparatus in FIG. 1. Please refer to FIG. 2. The fluid heat exchange apparatus 100 further includes a partition 180 disposed in the chamber 122 and interposed between the inlet 124 and the heat-dissipating device 140. The partition 180 separates the first channel 1221 and the second channel 1222 from each other. The partition 180 has an inclined plane 182 located at the first exit 1221b. A necking portion 1221e is formed between the inclined plane 182 and the heat-dissipating device 140. In addition, as illustrated in FIG. 1, in the present embodiment, the first channel 1221 and the second channel 1222 are separated by the partition 180. Therefore, as shown in FIG. 1, the first entrance 1221a and the second exit 1222b are located at the same cross section, and the first exit 1221b and the second entrance 1222a are located at another cross section. In the present embodiment, a ratio of thicknesses of the second entrance 1222a, the first exit 1221b and the partition 180 is designed to be 7:2:1.

Figure 3:
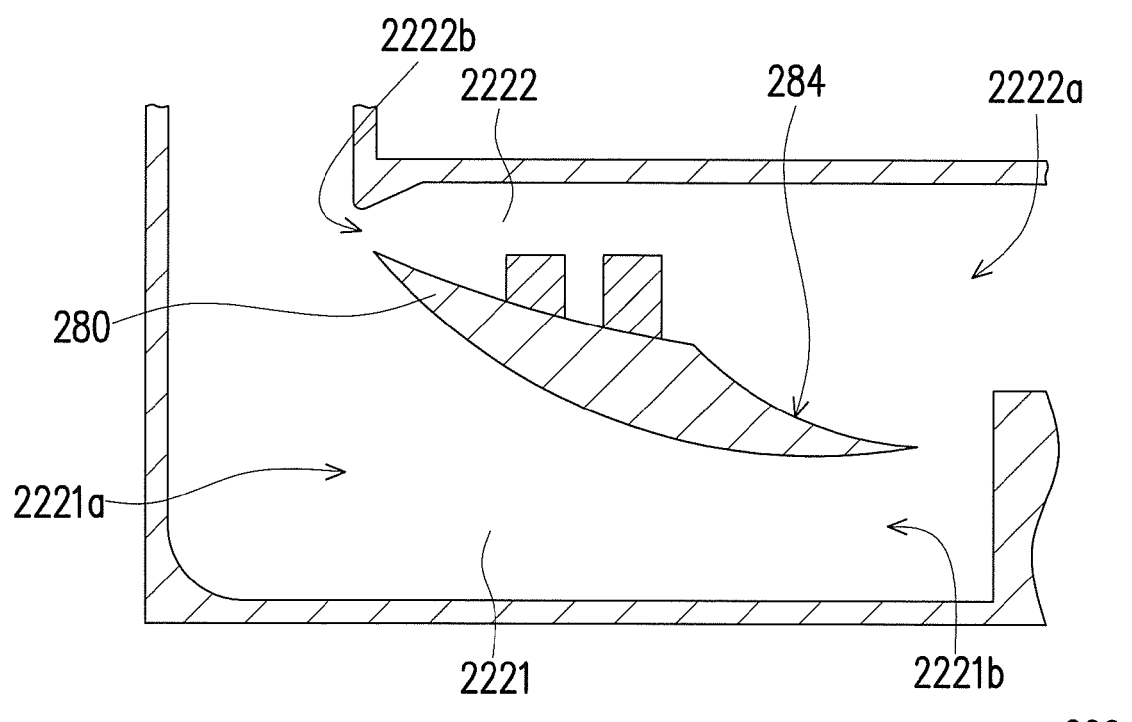
FIG. 3 illustrates another embodiment of a partition.

The design of the partition 180 is not limited to that illustrated in FIG. 2. FIG. 3 illustrates another embodiment of a partition. Please refer to FIG. 3. In the embodiment of FIG. 3, a partition 280, similarly, separates a first channel 2221 and a second channel 2222 from each other. Moreover, in the present embodiment, an inclined plane 284 is located at a second entrance 2222a to reduce possibility of occurrence of turbulent flow when the first fluid 100A flows out from a first exit 2221b.

Since presence of the inclined plane 284 reduces the thickness of the partition 280 at the second entrance 2222a, in the present embodiment, a ratio of cross-sectional area of the first entrance 2221a to that of a second exit 2222b is 9:1, and a ratio of cross-sectional area of the second entrance 2222a to that of a first exit 2221b is 7:2.

Please again refer to FIG. 2. In the present embodiment, side walls of the first channel 1221 and the second channel 1222 are formed as smooth curved surfaces. In detail, the first channel 1221 has an upper side wall 1221c and a lower side wall 1221d. The upper side wall 1221c is defined by a smooth curve with variable slopes from the first entrance 1221a to the first exit 1221b, in which the slope of the smooth curve becomes smaller and smaller from the first entrance 1221a to the first exit 1221b. The lower side wall 1221d is formed as flat. Accordingly, the cross-sectional area of the first channel 1221 decreases from the first entrance 1221a to the first exit 1221b. The present embodiment illustrates the example in which the upper side wall 1221c is defined by a smooth curve with variable slopes. Nonetheless, in other embodiments, it may be the lower side wall 1221d that is defined by a smooth curve having different slopes. In addition, the second channel 1222 has an upper side wall 1222c and a lower side wall 1222d. The upper side wall 1222c and the lower side wall 1222d come closer to each other from the second entrance 1222a to the second exit 1222b. Accordingly, the cross-sectional area of the second channel 1222 decreases from the second entrance 1222a to the second exit 1222b.

In summary, in the fluid heat exchange apparatus of the invention, the cross-sectional area of the first channel decreases from the first entrance to the first exit. Accordingly, the flow speed of the first fluid flowing through the first channel increases from the first entrance to the first exit, while pressure decreases from the first entrance to the first exit, so that the first fluid flows naturally from the first entrance to the first exit, and load on the pump during operation of the fluid heat exchange apparatus is reduced. Furthermore, after flowing out from the first exit, the first fluid is vaporized into bubbles by absorbing heat when flowing through the heat-dissipating device. The bubbles flow into the second channel, and then condense into liquid by means of the heat-absorbing device. Therefore, the chamber does not get clogged with the bubbles and the flow of the first fluid is not affected.

In addition, when the bubbles enter the second channel, as the cross-sectional area of the second channel decreases from the second entrance to the second exit, while the second fluid condensed by the bubbles flows through the second channel, the flow speed of the second fluid is increasing. Consequently, when the second fluid joins the first fluid after flowing out of the second channel, the first fluid is driven to speed up due to the high speed of the second fluid. Based on the above, the fluid heat exchange apparatus of the invention solves the problem of bubble clogging and improves flow efficiency of a fluid flowing therein.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A fluid heat exchange apparatus comprising:
a casing having a chamber, an inlet and an outlet, the chamber communicating between the inlet and the outlet, the inlet being configured to allow a first fluid to flow into the chamber, and the outlet being configured to allow the first fluid to flow out of the chamber, the chamber comprising a first channel having a first entrance and a first exit and a second channel having a second entrance and a second exit, the first entrance and the second exit being communicated to the inlet, wherein a cross-sectional area of the first channel decreases from the first entrance to the first exit and a cross-sectional area of the second channel decreases from the second entrance to the second exit, wherein the first entrance and the second exit being at close proximity, wherein a portion of the first fluid flows from the inlet to the outlet via the first entrance and the first exit in sequence, and another portion of the first fluid flows from the first entrance to the first exit, and then back-flows to the first entrance via the second entrance and the second exit in sequence;
a heat-dissipating device disposed in the chamber and located between the first exit and the outlet.

2. The fluid heat exchange apparatus as claimed in claim 1, wherein the casing comprises a partition disposed in the chamber to separate the first channel and the second channel from each other, the partition has an inclined plane located at the first exit, and a necking portion is formed between the inclined plane and the heat-dissipating device.

3. The fluid heat exchange apparatus as claimed in claim 2, wherein a ratio of thicknesses of the second entrance, the first exit and the partition is 7:2:1.

4. The fluid heat exchange apparatus as claimed in claim 1, wherein the casing comprises a partition disposed in the chamber to separate the first channel and the second channel from each other, and the partition has an inclined plane located at the second entrance.

5. The fluid heat exchange apparatus as claimed in claim 1, wherein a ratio of cross-sectional area of the first entrance to that of the second exit is 9:1 and a ratio of cross-sectional area of the second entrance to that of the first exit is 7:2.

6. The fluid heat exchange apparatus as claimed in claim 1, wherein side walls of the first channel and the second channel are formed as smooth curved surfaces.

7. The fluid heat exchange apparatus as claimed in claim 1, wherein the second channel is located above the first channel.

8. The fluid heat exchange apparatus as claimed in claim 1, further comprising:
a heat-absorbing device disposed in the second channel, part of the first fluid flowing through the heat-dissipating device and vaporized by absorbing heat to form a plurality of bubbles moving to the second channel from the second entrance, the bubbles dissipating heat to form a second fluid after flowing through the heat-absorbing device, the second fluid converging into the first channel after flowing out of the second channel from the second exit.

* * * * *